(12) United States Patent
Kim et al.

(10) Patent No.: US 9,560,776 B2
(45) Date of Patent: Jan. 31, 2017

(54) IMAGE DISPLAY DEVICE

(71) Applicant: LG ELECTRONICS INC., Seoul (KR)

(72) Inventors: Kyeongdong Kim, Seoul (KR); Jaeyong Kim, Seoul (KR); Kwaneun Jin, Seoul (KR)

(73) Assignee: LG Electronics Inc., Seoul (KR)

( * ) Notice: Subject to any disclaimer, the term of this patent is extended or adjusted under 35 U.S.C. 154(b) by 33 days.

(21) Appl. No.: 14/677,527

(22) Filed: Apr. 2, 2015

(65) Prior Publication Data

US 2015/0289397 A1 Oct. 8, 2015

(30) Foreign Application Priority Data

Apr. 3, 2014 (KR) .................. 10-2014-0040154

(51) Int. Cl.
| | |
|---|---|
| *H05K 5/02* | (2006.01) |
| *H05K 5/00* | (2006.01) |
| *H05K 7/20* | (2006.01) |
| *G06F 1/16* | (2006.01) |
| *H04M 1/02* | (2006.01) |
| *G06F 1/20* | (2006.01) |
| *H04N 5/64* | (2006.01) |

(52) U.S. Cl.
CPC .............. *H05K 5/0204* (2013.01); *G06F 1/16* (2013.01); *G06F 1/1637* (2013.01); *G06F 1/203* (2013.01); *H04M 1/0202* (2013.01); *H05K 5/0017* (2013.01); *H05K 7/20127* (2013.01); *H04M 1/0266* (2013.01); *H04N 5/64* (2013.01)

(58) Field of Classification Search
CPC .......... G06F 1/20; G06F 1/203; G06F 1/1601; H05K 5/0204
USPC .................... 361/679.01, 679.02, 679.5, 682
See application file for complete search history.

(56) References Cited

U.S. PATENT DOCUMENTS

| | | | |
|---|---|---|---|
| 7,679,889 B2* | 3/2010 | Sakata | H05K 5/02 313/582 |
| 2012/0162570 A1* | 6/2012 | Lee | G02F 1/133308 349/58 |
| 2012/0287645 A1 | 11/2012 | Ju et al. | |
| 2013/0155655 A1* | 6/2013 | Lee | H05K 5/03 362/97.1 |
| 2014/0085907 A1 | 3/2014 | Jun | |
| 2014/0226266 A1* | 8/2014 | Kang | H01L 51/0097 361/679.01 |

(Continued)

FOREIGN PATENT DOCUMENTS

| | | |
|---|---|---|
| JP | 2013-257385 A | 12/2013 |
| KR | 10-2014-0007202 A | 1/2014 |
| KR | 10-2014-0010208 A | 1/2014 |

*Primary Examiner* — Tuan T Dinh
*Assistant Examiner* — Mukund G Patel
(74) *Attorney, Agent, or Firm* — Dentons US LLP

(57) ABSTRACT

An image display device includes: a display to output an image; a frame to cover at least a partial upper portion of a rear surface of the display and form an appearance; and a back cover coupled to the frame to cover the rear surface of the display, wherein the back cover includes a first cover disposed in a horizontal direction and detachably coupled to the frame; a second cover coupled to the first cover and disposed to overlap with the first cover; and a fixing member disposed at an inner side of the first cover and the second cover and fixes the second cover to the first cover.

19 Claims, 11 Drawing Sheets

(56) References Cited

U.S. PATENT DOCUMENTS

2014/0240906 A1* 8/2014 Seo .................. A47B 81/06
                                              361/679.01
2015/0185538 A1* 7/2015 Yamamichi .......... H04N 5/64
                                              349/60

* cited by examiner

IMAGE DISPLAY DEVICE

CROSS-REFERENCE TO RELATED APPLICATION

Pursuant to 35 U.S.C. §119(a), this application claims the benefit of earlier filing date and right of priority to Korean Application No. 10-2014-0040154, filed on Apr. 3, 2014 the contents of which is incorporated by reference herein in its entirety.

BACKGROUND

1. Field of the Disclosure

The present disclosure relates to an image display device including a back cover formed with vent holes.

2. Background

An image display device includes both a device of recording and/or reproducing images and a device of recording and/or reproducing audio. Examples of the image display device may include a TV set, a monitor, a projector, a tablet, and the like.

As image display devices become multifunctional, image display devices are implemented in the form of multimedia players supporting complex functions such as capturing still images or video, playing games, receiving broadcasts, and the like, in addition to outputting broadcast or playing images.

Many efforts are undergoing to support and enhance various functions such as multimedia player in view of hardware or software improvements. Various attempts corresponding to hardware portion include structural change and improvement to simplify an assembly structure of image display devices.

As one of example of the structural change and improvement, various studies and proposals on image display devices having a flexible display unit which may be varied in shape have been actively ongoing. A middle cabinet assembly covering a panel is configured to be bent when a flexible display unit is bent.

When a back cover covering a rear surface of a display unit is formed through injection molding, an appearance thereof may lack having a high-end product feeling or having elegance, thereby having a limitation in creating classy appearance thereof, and when vent holes are formed through pressing, the vent holes are highly visible, degrading a design of the back cover.

SUMMARY

Therefore, an aspect of the detailed description is to provide an image display device in which a portion of a back cover is formed with metal and vent holes and screw fastening portions are hidden, thus obtaining a simple, high-end appearance.

To achieve these and other advantages and in accordance with the purpose of this specification, as embodied and broadly described herein, an image display device may include: a display to output an image; a frame to cover at least a partial upper portion of a rear surface of the display and form an appearance; and a back cover coupled to the frame to cover the rear surface of the display, wherein the back cover includes a first cover disposed in a horizontal direction and detachably coupled to the frame; a second cover coupled to the first cover and disposed to overlap with the first cover; and a fixing member disposed on an inner side of the first cover and the second cover and fixes the second cover to the first cover.

The first cover may include: an exposed portion outwardly exposed and disposed between the frame and the second cover; and a coupling portion extending downwardly from the exposed portion to overlap with the second cover, and disposed at the inner side of the second cover.

The exposed portion may include: a vent hole formation portion having a recess formed at an outer end portion thereof and allowing an upper end of the second cover to be inserted therein and a plurality of vent holes at the vent hole formation portion thereof; a vertical portion extending upwardly from the vent hole formation portion; and a heat blocking portion extending from the vertical portion and coupled to the frame to prevent introduction of heat emitted from the vent holes back to the image display device.

The coupling portion may include: a base portion having a plate shape and extending downwardly from an end of the exposed portion; and first to third ribs disposed in a horizontal direction at an inner side of the base portion, wherein a first long hole may be formed between the first rib and the vent hole formation portion, a second long hole may be formed between the second rib and the third rib, and the fixing member may be inserted into the first and second long holes.

The fixing member may include: a first portion inserted into the first long hole; a second portion extending vertically from the first portion and formed to be parallel to the first rib; a third portion extending from the second portion and traversing upper portions of the first and second ribs; a fourth portion extending vertically from the third portion and formed to be parallel to the second rib; and a fifth portion extending from the fourth portion and inserted into the second long hole.

A boss may be disposed between the first and second ribs at the inner surface of the base portion, a first hole may be formed at a position of the third portion of the fixing member corresponding to the boss, and the fixing member may be fixed to the first cover by a first fastening member passing through the first hole and the boss.

A protrusion may be disposed at one side of the boss at the inner surface of the base portion, a second hole may be formed at a position of the third portion corresponding to the protrusion, and the protrusion may be insertedly fixed to the second hole.

The second cover includes a main surface and may include a bent portion disposed to be perpendicular to the main surface of the second cover and inserted into the first long hole.

The fixing member may further include a first contact portion vertically extending from the first portion and disposed to be parallel to the vent hole formation portion to fix the bent portion to the vent hole formation portion.

The second cover may further include an insertion portion inserted into a recess formed in the vent hole formation portion, and the bent portion and the insertion portion may be connected to each other.

The fixing member may further include a second contact portion extending vertically from the fifth portion and disposed to be parallel to the third rib.

A through hole may be formed in the vertical portion, and the first cover may be fixed to the frame by coupling a second fastening member to the frame through the through hole.

When the display has a curved shape, both ends of the first rib and the second rib may have a height increasing in a direction towards a central portion of the display, and the fixing member may be sloped to correspond to the first rib and the second rib.

The first cover may be formed with non-metal, and the second cover may be formed with metal.

The frame may include a sloped portion that slopes outwardly down from an upper end portion thereof, a horizontal portion extending from the sloped portion and recessed inwardly toward the display, and a mounting portion extending from the horizontal portion and allowing the first cover or the second cover mounted to be thereon.

The exposed portion may be disposed between the horizontal portion and the mounting portion, an edge portion protruding toward the horizontal portion may be disposed in an end portion of the heat blocking portion, and a support portion having a height corresponding to the edge portion may be disposed below the horizontal portion.

The second portion and the fourth portion may be in contact with inner surfaces of the first and second long holes or may be in contact with the first rib and the second rib, respectively, and the boss and the protrusion may be connected by a connection portion.

The fifth portion may be in contact with the third rib.

According to the present exemplary embodiments, since the vent holes are formed to be perpendicular to the display, the vent holes are not exposed outwardly, and since the first cover and the second cover are coupled by the fixing member positioned on an inner side thereof, assembling and disassembling of the image display device are facilitated and the image display device has a classy appearance.

Also, since the first cover is formed through injection molding and the second cover is formed with metal, a metal feeling may be obtained.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the invention.

In the drawings.

DETAILED DESCRIPTION OF THE EXEMPLARY EMBODIMENTS

An image display device according to exemplary embodiments of the present disclosure will be described in detail with reference to the accompanying drawings.

In the specification, like numbers refer to like elements throughout although the embodiments may be different, and a description of the like elements in a first embodiment may be used for those of the different embodiments. A singular representation may include a plural representation unless it represents a definitely different meaning from the context.

An image display device according to the present disclosure may include both a device of recording and/or reproducing images and a device for recording and/or reproducing audio by receiving and outputting broadcasts. Hereinafter, a TV as an example of the image display device will be illustrated.

Figure 1:
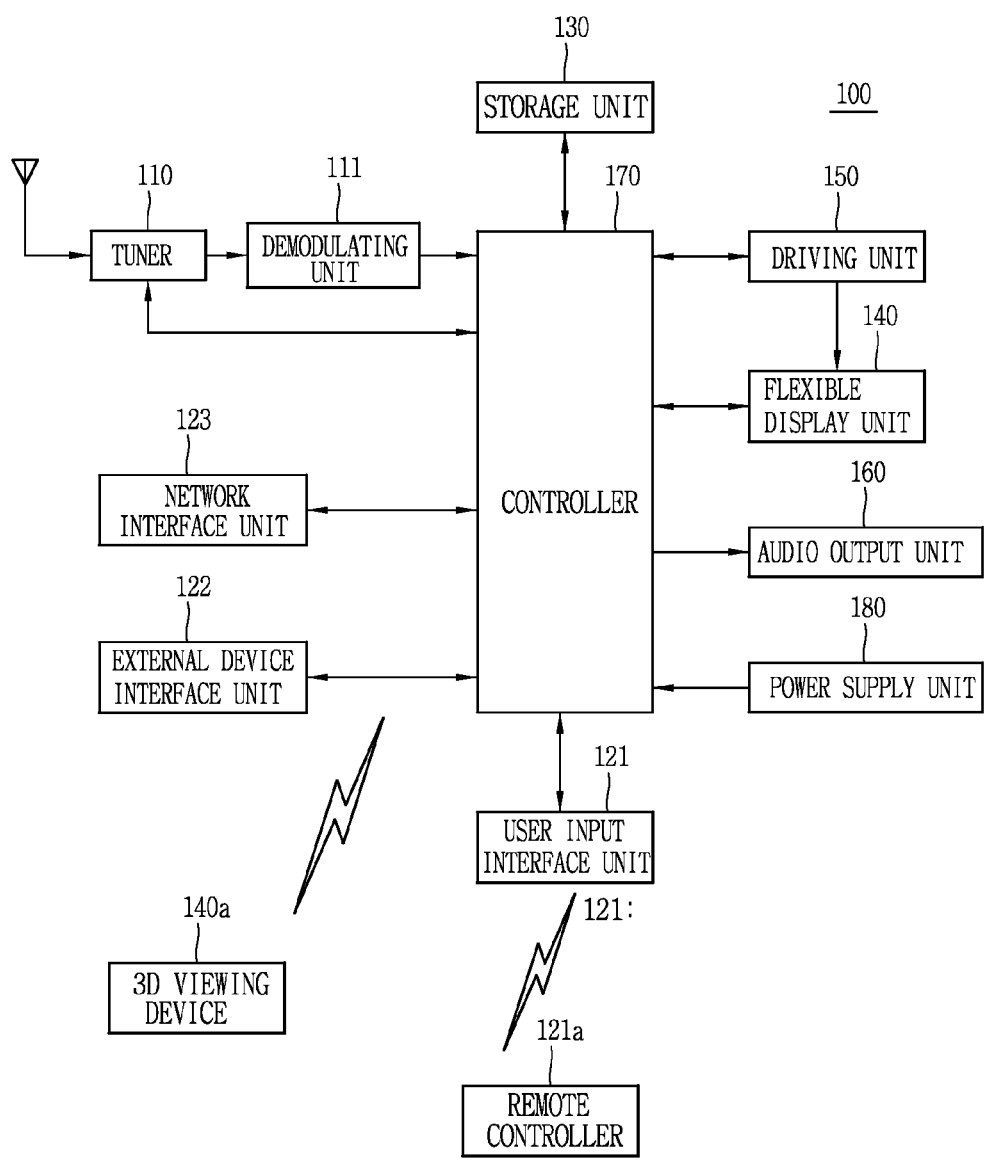
FIG. 1 is a block diagram illustrating an image display device and a remote controller according to an exemplary embodiment of the present disclosure.

FIG. 1 is a block diagram of an image display device 100 and a remote controller 121a according to an exemplary embodiment of the present disclosure.

As illustrated in FIG. 1, the image display device 100 may include a tuner 110, a demodulating unit 111, an external device interface 122, a network interface 123, a storage unit 130, a user input interface 121, a controller 170, a flexible display unit 140, a driving unit 150, an audio output unit 160, a power supply unit 180, and a 3D viewing device 140a.

The tuner 110 may select a radio frequency (RF) broadcast signal, which corresponds to a channel selected by a user, among RF broadcast signals received through an antenna, or every pre-stored channel. The tuner 110 may also convert the selected RF broadcast signal into a medium frequency signal or a baseband video or audio signal.

For example, when the RF broadcast signal selected is a digital broadcast signal, the tuner 110 may convert the RF broadcast signal into a digital IF signal (DIF). On the other hand, when the RF broadcast signal is an analog broadcast signal, the tuner 110 may convert the RF broadcast signal into an analog baseband video or audio signal (CVBS/SIF). That is, the analog baseband image or audio signal (CVBS/SIF) outputted from the tuner 110 may be inputted directly into the controller 170.

Also, the tuner 110 may receive a signal carrier RF broadcast signal according to an advanced television systems committee (ATSC) standard or a multi-carrier RF broadcast signal according to a digital video broadcasting (DVB) standard.

Meanwhile, the tuner 110 may sequentially select RF broadcast signals of all the broadcast channels stored through a channel memory function, of RF broadcast signals received via an antenna, and convert those RF broadcast signals into a medium frequency signal or a baseband video or audio signal.

The demodulating unit 111 may execute a decoding operation by receiving a digital IF signal (DIF) converted in the tuner 110.

For example, when the digital IF signal outputted from the tuner 110 is a signal according to the ATSC standard, the demodulating unit 111 may perform 8-vestigal side band (8-VSB) demodulation. Here, the demodulating unit 111 may also perform trellis decoding, de-interleaving, reed Solomon decoding and the like. To this end, the demodulating unit 111 may include a trellis decoder, de-interleaver, a reed Solomon decoder and the like.

As another example, when the digital IF signal (DIF) outputted from the tuner 110 is a signal according to the DVB standard, the demodulating unit 111 may perform a coded orthogonal frequency division modulation (COFDMA) demodulation. Here, the demodulating unit 111 may also perform convolution decoding, de-interleaving, reed Solomon decoding and the like. To this end, the demodulating unit 111 may include a convolution decoder, a de-interleaver, a reed Solomon decoder and the like.

The demodulating unit 111 may output a stream signal after decoding and channel decoding. Here, the stream signal may be a signal in which an image signal, an audio signal and a data signal are multiplexed. As one example, the stream signal may be an MPEG-2 transport stream (TS) signal obtained by multiplexing an MPEG-2 image signal and a Dolby AC-3 audio signal. In detail, an MPEG-2 TS signal may include a 4-byte header and a 184-byte payload.

The demodulating unit 111 may be provided separately according to the ATSC standard and the DVB standard. That is, an ATSC decoder and a DVB decoder may be provided.

The stream signal outputted from the demodulating unit 111 may be inputted into the controller 170. The controller 170 may perform demultiplexing, video/audio signal processing and the like, output video on the flexible display unit 140 and output audio to the audio output unit 160.

The external device interface 122 may connect an external device and the image display device 100 to each other. To this end, the external device interface 122 may include an A/V input/output unit (not shown) or a wireless communication unit (not shown).

The external device interface 122 may be connected, in a wired or wireless manner, to an external device, such as a digital versatile disk (DVD), a Bluray, a game machine, a camera, a camcorder, a laptop computer (notebook) and the like. The external device interface 122 may transfer a video, audio or data signal input from the exterior via the connected external device to the controller 170 of the image display device 100, and also output a video, audio or data signal processed in the controller 170 to the external device.

The A/V input/output unit may include a USB terminal, a composite video banking sync (CVBS) terminal, a component terminal, a S-video terminal (analog), a digital visual interface (DVI) terminal, a high definition multimedia interface (HDMI) terminal, an RGB terminal, a D-SUB terminal, and the like to allow video and audio signals of the external device to be inputted into the image display device 100.

The wireless communication unit may execute short-range wireless communication with other electronic devices. The image display device 100 may be connected to other electronic device via a network according to communication standards, such as Bluetooth, radio frequency identification (RFID), infrared data association (IrDA), ultra wideband (UWB), ZigBee and the like.

The external device interface 122 may also be connected via at least one of various set-top boxes and the aforementioned various terminals, to execute input/output operations with the set-top boxes.

The external device interface 122 may execute data transmission and reception with the 3D viewing device 140a.

The network interface 123 may provide an interface for connecting the image display device 100 to a wired or wireless network which includes an Internet network. The network interface 123 may include an Ethernet terminal for connection to the wired network, and use communication standards, such as wireless LAN (WLAN) (Wi-Fi), wireless broadband (Wibro), world interoperability for microwave access (Wimax), high speed downlink packet access (HSDPA) and the like for connection to the wireless network.

The network interface 123 may receive contents or data provided by a contents provider or a network operator via a network. That is, the network interface 123 may receive contents, such as a movie, an advertisement, a game, a VOD, a broadcast signal provided by the network operator, and related information via the network. The network interface 123 may also receive update information related to firmware and update files provided by the network operator. Also, the network interface 123 may transmit data to the contents provider or the network operator.

The network interface 123 may be connected to, for example, an Internet protocol (IP) TV, so as to receive a video, audio or data signal processed in an IPTV set-top box and transfer it to the controller 170 for allowing bi-directional communication. The network interface 123 may also transfer signals processed in the controller 170 to the IPTV set-top box.

The IPTV may indicate ADSL-TV, VDSL-TV, FTTH-TV or the like or indicate TV over DSL, Video over DSL, TV overIP (TVIP), Broadband TV (BTV) or the like, according to a type of transmission network. Also, the IPTV may indicate an Internet-accessible Internet TV, and a full-browsing TV.

The storage unit 130 may store programs for signal processing and control by the controller 170, and also store processed video, audio or data signals.

The storage unit 130 may execute a function of temporarily storing a video, audio or data signal input via the external device interface 122. Also, the storage unit 130 may store information related to a predetermined broadcast channel through a channel memory function of a channel map and the like.

The storage unit 130 may include at least one storage medium of a flash memory-type storage medium, a hard disc-type storage medium, a multimedia card micro-type storage medium, a card-type memory (for example, SD or XD memory), a random access memory (RAM), a read-only memory (ROM) (e.g., electrically erasable programmable ROM (EEPROM)), and the like. The image display device 100 may reproduce a file (a video file, a still image file, a music file, a document file, etc.) stored in the storage unit 130 to provide to a user.

FIG. 1 illustrates an exemplary embodiment in which the storage unit 130 is provided separate from the controller 170. However, the present invention is not limited thereto and the storage unit 130 may be configured to be included in the controller 170.

The user input interface 121 may transfer a user-input signal to the controller 170, or a signal from the controller 170 to the user.

For example, the user input interface 121 may receive a user input signal, such as a power on/off, a channel selection, a screen setting and the like from the remote controller 121a, or transmit a signal from the controller to the remote controller 121a, according to various communication standards, such as RF communication, IR communication and the like.

The user input interface 121, for example, may also transfer a user input signal, which is inputted from a local key (not shown), such as a power key, a channel key, a volume key, or a setting key, to the controller 170, for example.

Also, for example, the user input interface 121 may transfer a user input signal, which is inputted from a sensing unit (not shown) for sensing a user's gesture, to the controller 170 or transmit a signal from the controller 170 to the sensing unit (not shown). Here, the sensing unit may include a touch sensor, a voice sensor, a position sensor, a motion sensor and the like.

The controller 170 may demultiplex stream, which is inputted via the tuner 110, the demodulating unit 111 or the external device interface 122 or process the demultiplexed signals, to generate and output signals for outputting video or audio.

The image signal processed in the controller 170 may be inputted to the flexible display unit 140 to be outputted as an image corresponding to the image signal. Also, the image signal processed in the controller 170 may be inputted to an external output device through the external device interface 122.

The audio signal processed in the controller 170 may be outputted to the audio output unit 160. The audio signal processed in the controller 170 may be inputted to an external output device through the external device interface 122. Although not shown in FIG. 1, the controller 170 may include a demultiplexer, an image processor and the like.

Besides, the controller 170 may control an overall operation of the image display device 100. For example, the controller 170 may control the tuner 110 to select an RF broadcast corresponding to a user-selected channel or a pre-stored channel.

The controller 170 may also control the image display device 100 by a user command inputted via the user input interface 121 or an internal program.

For example, the controller 170 may control the tuner 110 to input a signal of a channel, which is selected in response to a predetermined channel select command received via the user input interface 121. The controller 170 may then process a video, audio or data signal of the selected channel. The controller 170 may control information related to the user-selected channel to be outputted through the flexible display unit 140 or the audio output unit 160 together with the processed video or audio signal.

As another example, the controller 170 may control a image signal or an audio signal, which is inputted from an external device, for example, a camera or a camcorder through the external device interface 122 in response to an external device image reproduce command received through the user input interface 121, to be outputted through the flexible display unit 140 or the audio output unit 160.

The controller 170 may control the flexible display unit 140 to display an image. For example, the controller 170 may control the flexible display unit 140 to output a broadcast image inputted through the tuner 110, an externally input image inputted through the external device interface 122, an image inputted through the network interface 123, or an image stored in the storage unit 130.

Here, the image output on the flexible display unit 140 may be a still image or a video, and a 2D or 3D image.

The controller 170 may allow a predetermined object within the image displayed on the flexible display unit 140 to be generated and displayed as a 3D object. For example, the object may be at least one of an accessed web screen (a newspaper, a journal, etc.), an electronic program guide (EPG), various menus, a widget, an icon, a still image, a video, and text.

The 3D object may be processed to have a different depth from the image displayed on the flexible display unit 140. Preferably, the 3D object may be processed to seem to protrude more than the image displayed on the flexible display unit 140.

The controller 170 may recognize a user's location based on an image captured by a capturing element (not shown). For example, the controller 170 may recognize a distance (z-axial coordinates) between the user and the image display device 100. Also, the controller 170 may recognize x-axial coordinates and y-axial coordinates within the image display device 100 corresponding to the user's location.

Although not shown, the image display device 100 may further include a channel browsing processor, which generates a thumbnail image corresponding to a channel signal or an externally input signal. The channel browsing processor may receive a stream signal outputted from the demodulating unit 111 or a stream signal outputted from the external device interface 122, extract an image from the input stream signal, and generate a thumbnail image. The generated thumbnail image may be inputted to the controller 170 as is or after being encoded. Also, the generated thumbnail image may be inputted to the controller 170 after being encoded into a stream format. The controller 170 may output on the flexible display unit 140 a thumbnail list including a plurality of thumbnail images using the input thumbnail image. The thumbnail list may be displayed in a viewing manner in which the list is displayed on a partial region displaying a predetermined image on the flexible display unit 140, or in a fully viewing manner in which the list is displayed on most regions of the flexible display unit 140.

The flexible display unit 140 may generate a driving signal by converting an image signal, a data signal, an OSD signal and a control signal processed in the controller 170, or an image signal, a data signal and a control signal received via the external device interface 122.

The present disclosure illustrates that the flexible display unit 140 is transformable (variable) into a flat form or a curved form. When the flexible display unit 140 is transformed into the curved form like surrounding a user located in front thereof, the flexible display unit 140 may provide the user with intense quality of image and allow the user to feel more involved in an image displayed thereon. The flexible display unit 140 may be implemented by an OLED panel, for example.

The flexible display unit 140 may be configured to provide a 3D image to a user. To view the 3D image, the flexible display unit 140 may be classified into an additional displaying method and an independent displaying method.

The independent displaying method may be configured such that a 3D image can be implemented only by the flexible display unit 140 without a separate 3D viewing device 140a, for example, 3D glasses or the like. Various technologies such as a lenticular technology, a parallax barrier technology and the like may be applied as the independent displaying method.

The additional displaying method may be configured to implement a 3D image by using the 3D viewing device 140a in addition to the flexible display unit 140. As one example, various methods such as a head mount display (HMD) type, a glass type and the like may be applied. Also, the glass type may be divided into a passive glass type such as a polarized glass type and the like, and an active glass type such as a shutter glass type and the like. The HMD type may also be divided into a passive HMD type and an active HMD type.

The flexible display unit 140 may be implemented as a touch screen so as to be used as an input device as well as an output device.

The driving unit 150 may transform the flexible display unit 140 into a flat form or a curved form. The driving unit 150 may transmit an electric signal to the flexible display unit 140 such that the flexible display unit 140 can be transformed by itself, or apply a physical force to the flexible display unit 140 directly or indirectly to transform the flexible display unit 140.

The audio output unit 160 may output sound by receiving an audio signal processed in the controller 170, for example, a stereo signal, a 3.1 channel signal or a 5.1 channel signal. The audio output unit 160 may be implemented by various types of speakers.

To sense a user's gesture, as aforementioned, the image display device 100 may further include a sensing unit (not shown) having at least one of a touch sensor, a voice sensor, a location sensor, and a motion sensor. A signal sensed by the sensing unit may be transferred to the controller 170 via the user input interface 121.

The controller 170 may sense a user's gesture based on an image captured by the capturing element (not shown), a signal sensed by the sensing unit (not shown) or a combination thereof.

The power supply unit 180 may supply power to every component of the image display device 100. Especially, the power supply unit 180 may supply power to the controller 170 which may be implemented in a form of a system on chip (SOC), the flexible display unit 140 to display an image, and the audio output unit 185 to output an audio. Also, depending on embodiments, power may be supplied to a heat generator including a hot wire to flex the flexible display unit 140.

The remote controller 121a may transmit a user input to the user input interface 121. To this end, the remote controller 121a may use various communication standards, such as IR communication, RF communication, Bluetooth, ultra wideband (UWB), ZigBee and the like. Also, the remote controller 121a may receive a video, audio or data signal output from the user input interface 121, so as to display the signal on the remote controller 121a or output the signal on the remote controller 121a in a form of sound.

The image display device 100 may include a fixed digital broadcast receiver capable of receiving at least one of ATSC (8-VSB) broadcast programs, DVB-T (COFDM) broadcast programs, and ISDB-T (BST-OFDM) broadcast programs or a mobile digital broadcast receiver capable of receiving at least one of terrestrial DMB broadcast programs, satellite DMB broadcast programs, ATSC-M/H broadcast programs, DVB-H (COFDM) broadcast programs, and Media Forward Link Only (MediaFLO) broadcast programs. Alternatively, the image display device 100 may include an IPTV digital broadcast receiver capable of receiving cable broadcast programs, satellite broadcast programs or IPTV programs.

The image display device disclosed herein may include a TV receiver, a cellular phone, a smart phone, a notebook computer, a digital broadcasting terminal, a personal digital assistant (PDA), a portable multimedia player (PMP) and the like.

The block diagram of the image display device illustrated in FIG. 1 is a block diagram of one exemplary embodiment. Each component of the block diagram may be combined, added or omitted according to the configuration of the image display device 100. That is, if necessary, two or more components may be combined into one component, or one component may be divided into two components. Also, a function performed in each block is merely illustrative, and a detailed operation or device may not limit the scope of the present disclosure.

Figure 2:
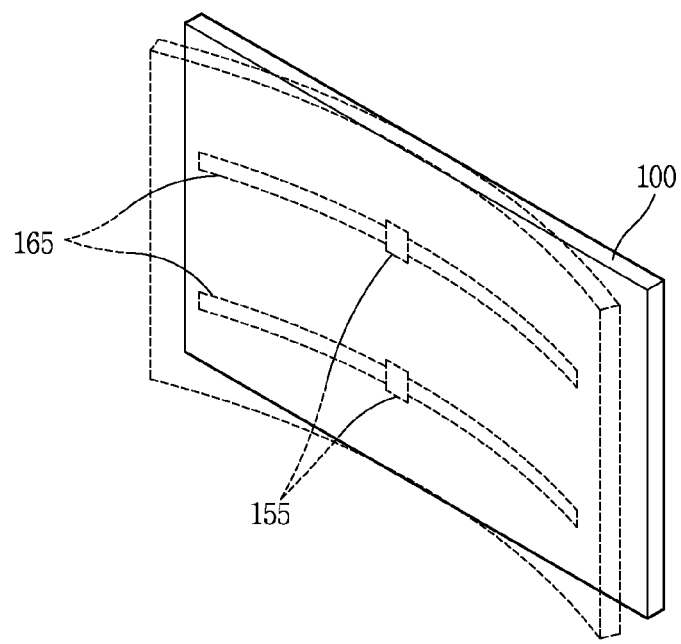
FIG. 2 is a conceptual view illustrating an image display device according to an exemplary embodiment of the present disclosure.

FIG. 2 is a conceptual view illustrating an image display device 100 according to an exemplary embodiment of the present disclosure.

Referring to FIG. 2, the flexible display unit 140 is bent by external force between a first state and a second state in which the flexible display unit 140 has different radii of curvature. For example, the first state may be a state in which the flexible display unit 140 is flat, and the second state may be a state in which the flexible display unit 140 is bent to have a curved form (namely, is curved).

When the flexible display unit 140 is bent to enclose the user at the front side thereof upon receiving external force, realistic picture quality and immersiveness may be provided to the user. The curved flexible display unit 140 may be restored to be flat by external force.

In order to allow the flexible display unit 140 to be curved, the image display device 100 may include pressing members 165 and driving units 155 for deforming the flexible display unit 140.

The pressing members 165, when bent, apply external force to the flexible display unit 140. As illustrated in FIG. 2, the pressing members 165 may be formed as bar-shaped plates disposed in a width direction (traverse direction) of the flexible display unit 140. In order to ensure stable driving, a plurality of pressing members 165 may be provided. For example, the plurality of pressing members 165 may be disposed to correspond to upper and lower portions of the flexible display unit 140.

The driving units 155 are formed to push both end portions of the pressing members 165 such that the pressing members 165 are bent. When both end portions of the pressing members 165 are pushed by the driving units 155, the pressing members 165 may press on the flexible display unit 140. According to this mechanism, the flexible display unit 140 in a flat state may be bent to have a curved shape.

The driving units 155 may be formed to push both end portions of the pressing members 165 in a first direction such that the flexible display unit 140 in a flat state is changed to be bent, and pull both end portions of the pressing members 165 in a second direction different from the first direction such that the flexible display unit 140 in a bent state is changed to be flat. Thus, the flexible display unit 140 may become flat or bent according to a direction in which the driving units 155 pull or push both end portions of the pressing members 165.

The pressing members 165 may be disposed to be parallel to the flexible display unit 140, and may be configured to press on at least a portion of the flexible display unit 140 when both end portions of the pressing members 165 are pulled by the driving unit 155.

Figure 3:
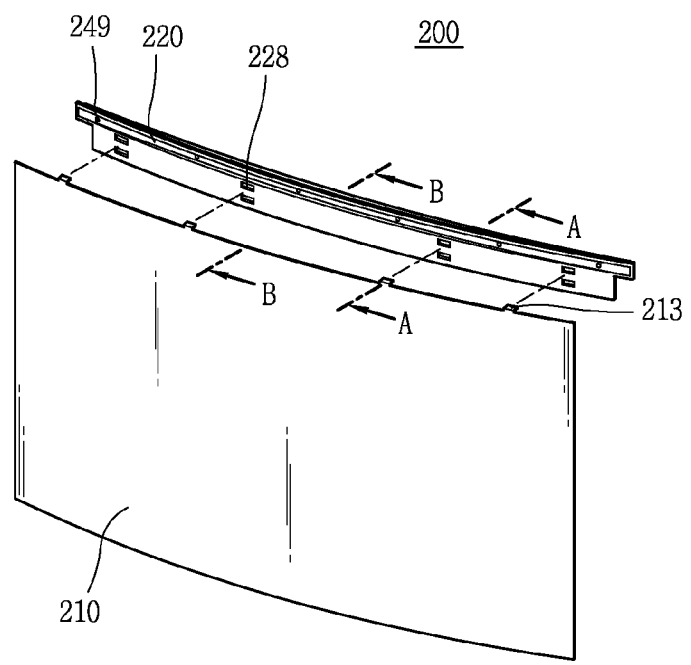
FIG. 3 is an exploded perspective view of a back cover of the image display device according to an exemplary embodiment of the present disclosure.
Figure 4:
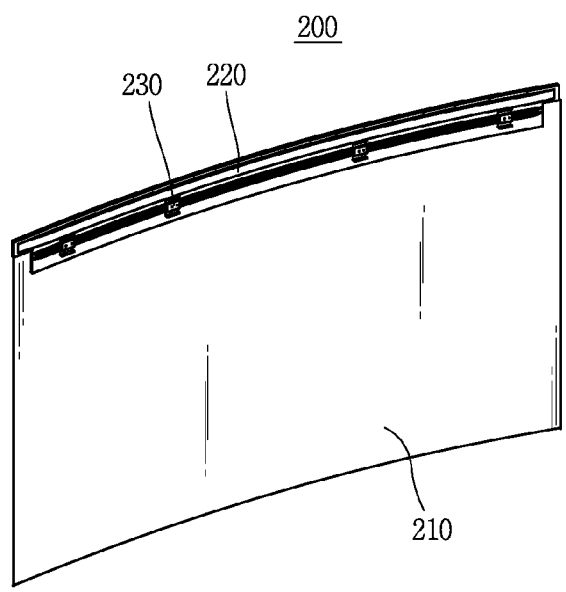
FIG. 4 is a perspective view of the back cover of the image display device according to an exemplary embodiment of the present disclosure viewed from an inner side thereof.
Figure 5:
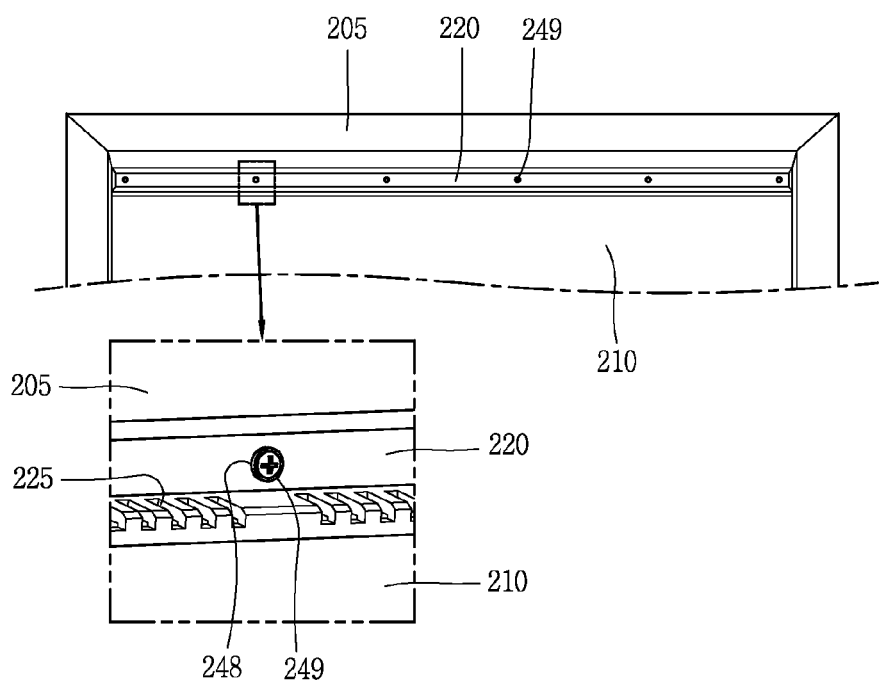
FIG. 5 is a partial rear view of the image display device according to an exemplary embodiment of the present disclosure.

FIG. 3 is an exploded perspective view of a back cover 200 of the image display device 100 according to an exemplary embodiment of the present disclosure, FIG. 4 is a perspective view of the back cover 200 of the image display device 100 according to an exemplary embodiment of the present disclosure viewed from an inner side thereof, and FIG. 5 is a partial rear view of the image display device 100 according to an exemplary embodiment of the present disclosure.

Referring to FIGS. 3 through 5, in the image display device 100 according to an exemplary embodiment of the present disclosure, a display 201 (see FIG. 6) outputting an image is disposed on a front surface, and a side surface and a rear surface of the display 201 are covered by a frame (or a middle cabinet) 205. The frame 205 is provided to cover edge portions of the rear surface of the display 201. In particular, the frame 205 related to an exemplary embodiment of the present disclosure covers a portion of an upper side of the rear surface of the display 201 to form an appearance, and the back cover 200 is coupled to the frame 205 and formed to cover the entirety of the rear surface of the display 201.

In an exemplary embodiment of the present disclosure, the back cover 200 includes a first cover 220 and a second cover 210. The first cover 220 is directly coupled to the frame 205, and the second cover 210 is coupled to the first cover 220 and covers most if not all of the rear surface of the display 201. That is, the first cover 220 is formed in a horizontal direction along the frame 205 and detachably attached to the frame 205, and the second cover 210 is disposed to be inserted into a lower end portion of the first cover 220 to overlap with the first cover 220. Here, the second cover 210 is fixed to the first cover 220 by a fixing member 230. The fixing member 230 is disposed on an inner side of the first and second covers 220 and 210 so as not to be exposed outwardly.

Also, the display 201 according to an exemplary embodiment of the present disclosure may be a curved or flexible display or may be flat.

Figure 6:
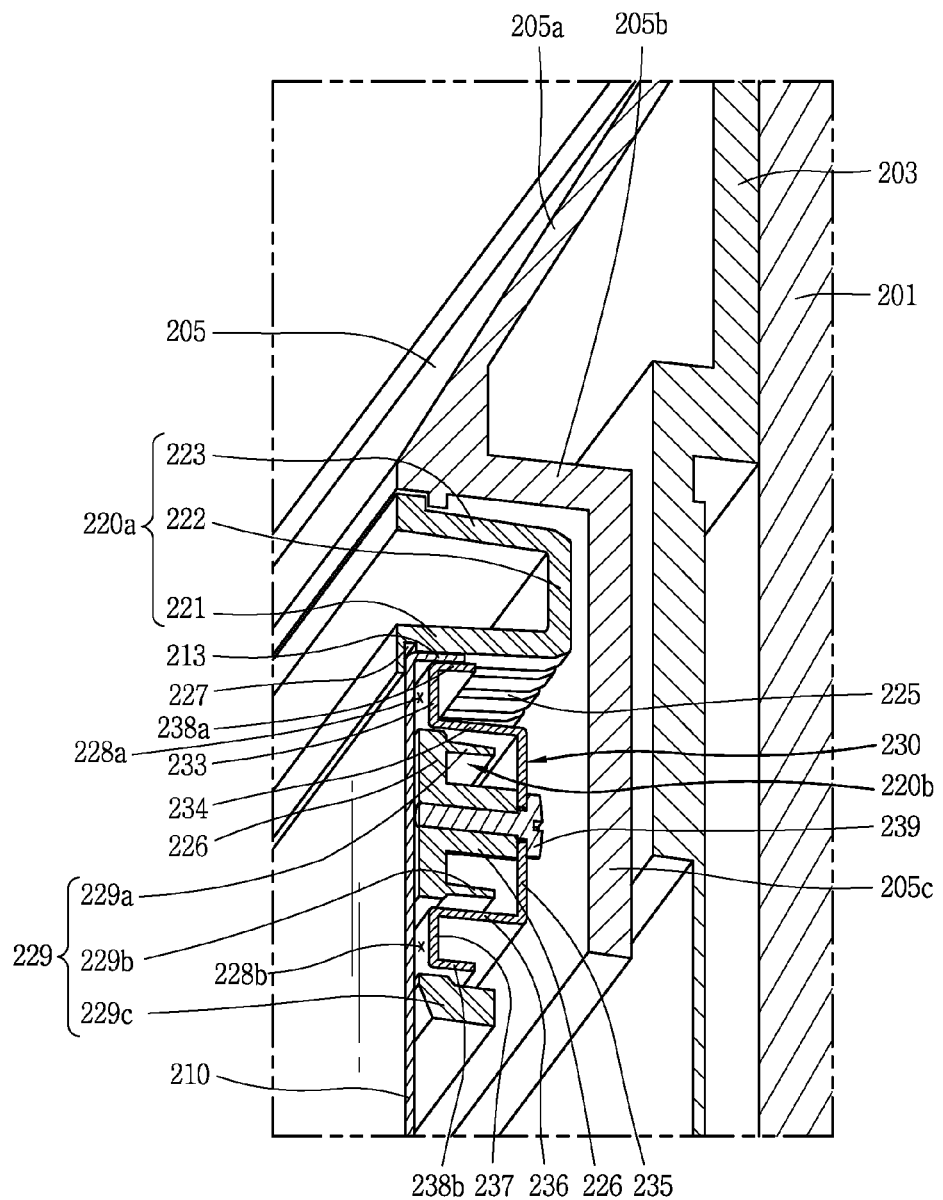
FIG. 6 is a partial cross-sectional view taken along line A-A of FIG. 3.
Figure 7:
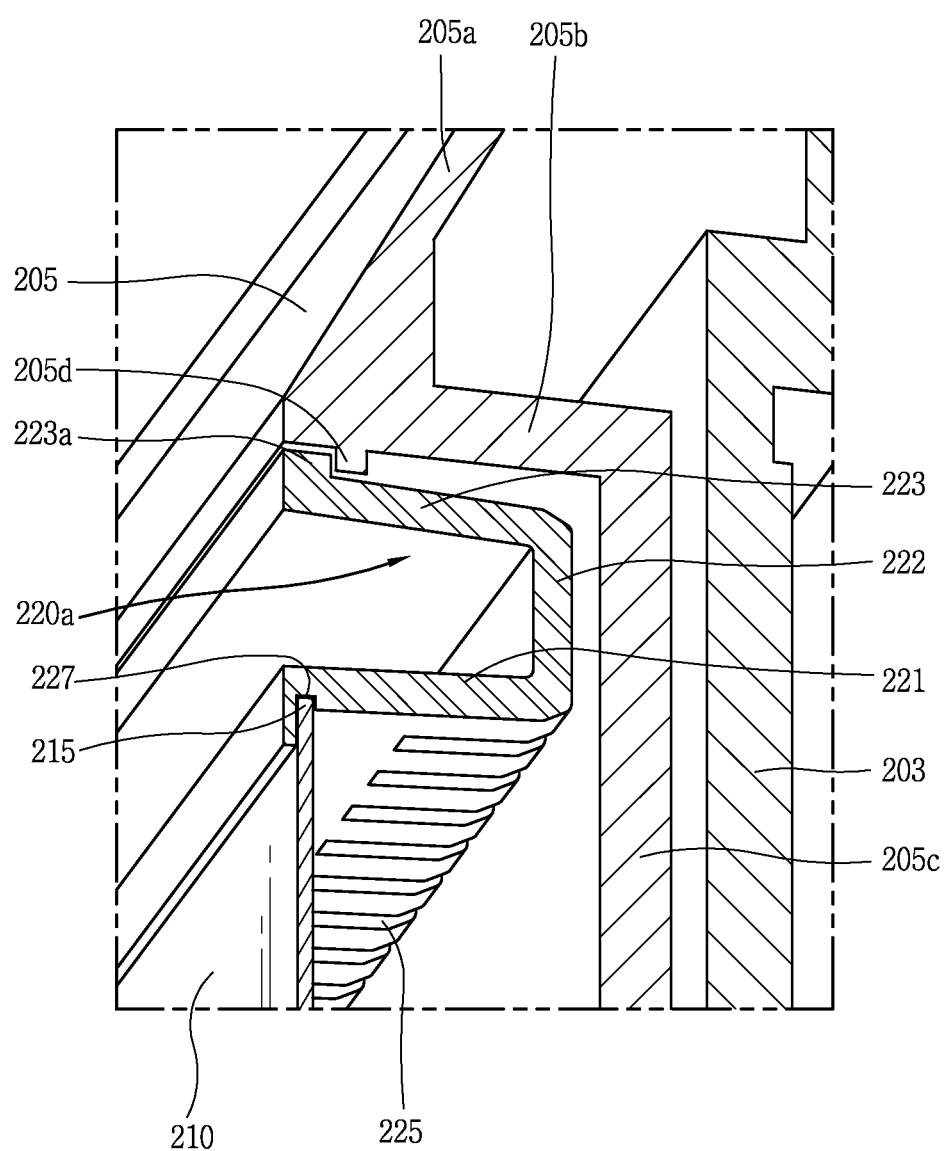
FIG. 7 is a partial cross-sectional view taken along line B-B of FIG. 3.

FIG. 6 is a partial cross-sectional view taken along line A-A of FIG. 3, and FIG. 7 is a partial cross-sectional view taken along line B-B of FIG. 3. Hereinafter, the back cover 200 according to an exemplary embodiment of the present disclosure will be described in detail with reference to FIGS. 6 and 7.

Referring to FIG. 6, a cover bottom 203 is provided at the rear surface of the display 201, and the frame 205 is provided at an outer side of the cover bottom 203. The frame 205 may be formed to correspond to a shape of the cover bottom 203. For example, in a portion in which the cover bottom 203 protrudes, the frame 205 may also protrude, and in a portion in which the cover bottom 203 is recessed, the frame 205 may also be recessed. However, even though the cover bottom 203 is recessed, the frame 205 may not always be recessed.

The first cover 220 may include an exposed portion 220a formed such that an upper end portion thereof is exposed outwardly, and a coupling portion 220b extending downwardly from the exposed portion 220a to overlap with the second cover 210, and disposed within the second cover 210.

The frame 205 may protrude from an upper end portion in a thickness direction (width direction). In an exemplary embodiment of the present disclosure, it is illustrated that the frame 205 is sloped to protrude outwardly in a downward direction. That is, the frame 205 illustrated in FIG. 6 includes a sloped portion 205a formed downwardly from an upper end portion, a horizontal portion 205b extending from the sloped portion 205a and recessed inwardly toward the display 201, and a mounting portion 205c extending from the horizontal portion 205b downwardly and allowing the first cover 220 or the second cover 210 to be mounted thereon. Here, the exposed portion 220a may be disposed between the horizontal portion 205b and the mounting portion 205c.

The mounting portion 205c is inwardly recessed by at least a height of the first cover 220. However, the shape of the frame 205 is not limited thereto and may have various other shapes.

The exposed portion 220a according to an exemplary embodiment of the present disclosure may have a substantially "C" shape. This is because, since the mounting portion 205c of the frame 205 is inwardly recessed, the exposed portion 220a has a shape corresponding thereto so that the exposed portion 220a may be tightly coupled to the mounting portion 205c.

That is, the exposed portion 220a has a recess 227 formed in an outer end portion and allowing an upper end of the second cover 210 to be inserted thereinto. In an inner end portion thereof, the exposed portion 220a has a vent hole formation portion 221 in which a plurality of vent holes 225 are formed, a vertical portion 222 extending from the vent hole formation portion 221 upwardly and disposed to be in contact with the mounting portion 205c, and a heat blocking portion 223 extending from the vertical portion 222 outwardly and attached to the frame 205 to prevent inflow of heat emitted from the vent holes 225.

The vent hole formation portion 221 is formed to be perpendicular to the display 201 such that heat can be easily discharged outwardly. A through hole 248 is formed on the vertical portion 222 recessed toward the display 201 to allow the first cover 220 to be fastened to the frame 205 by a second fastening member 249. Also, the heat blocking portion 223 in contact with the horizontal portion 205b may have a plate shape without a hole in order to prevent heat emitted from the vent holes 225 from being introduced back into to the image display device 100.

Also, in order to allow the first cover 220 and the frame 205 to be easily coupled, an edge portion 223a of the heat blocking portion 223 is formed in a horizontal direction and protrudes toward the horizontal portion 205b of the frame, and a support portion 205d is formed in a lower portion of the horizontal portion 205b and protrudes toward the lower portion to correspond to the edge portion 223a. The support portion 205d serves to support the edge portion 223a such that the edge portion 223a cannot move (see FIG. 7).

Figure 11:
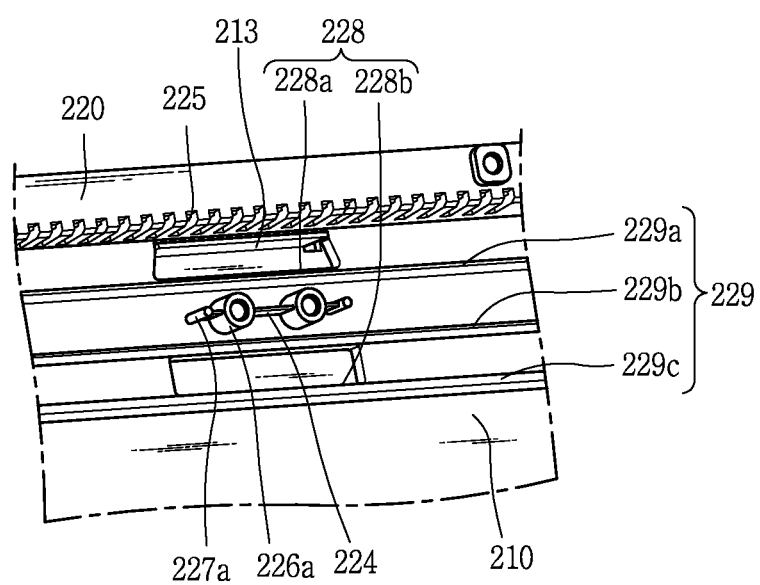
FIGS. 11 and 12 are perspective views illustrating a configuration in which a first cover and a second cover are coupled according to an exemplary embodiment of the present disclosure.
Figure 12:
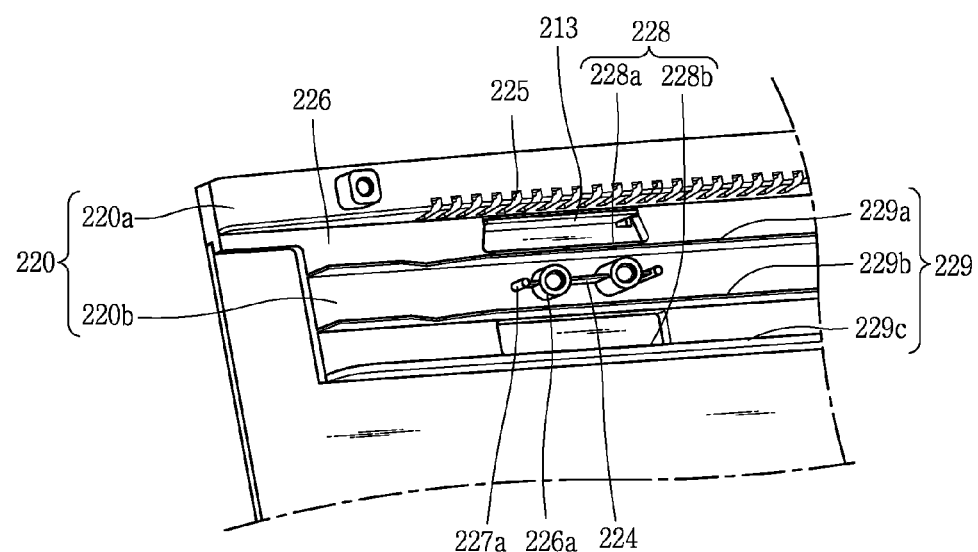
Figure 13:
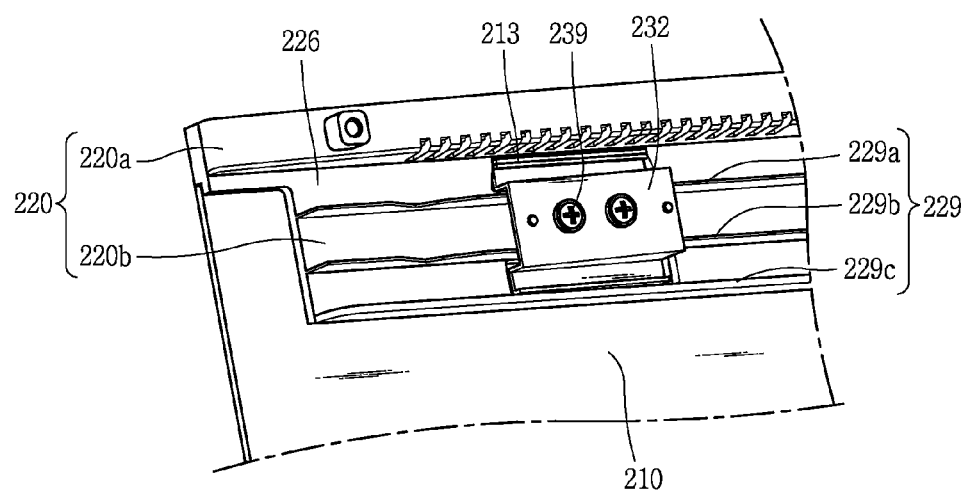
FIG. 13 is a perspective view illustrating a configuration in which the first cover and the second cover are fastened according to an exemplary embodiment of the present disclosure.

The coupling portion 220b may be integrally formed with the exposed portion 220a and overlaps the second cover 210 so as not to be exposed outwardly. FIGS. 11 and 12 are perspective views illustrating a configuration in which the first cover 220 and the second cover 210 are coupled according to an exemplary embodiment of the present disclosure, and FIG. 13 is a perspective view illustrating a configuration in which the first cover 220 is fastened to the second cover 210. Referring to FIGS. 11 through 13, the coupling portion 220b has a plate shape extending from an end of the exposed portion 220a downwardly and includes a base portion 226 overlapping the second cover 210 and first to third ribs 229 formed to be spaced apart from one another on an inner side of the base portion 226 in a horizontal direction. A first long hole 228a is formed between the first rib 229a and the vent hole formation portion 221, a second long hole 228b is formed between the second rib 229b and the third rib 229c, and portions 233 and 237 of the fixing member 230 (see FIG. 6) are inserted into the first and second long holes 228a and 228b. An upper portion of the second cover 210 and the base portion 226 of the coupling portion 220b may be in contact, and the first and second long holes 228a and 228b may have a substantially rectangular shape. Sizes of the first and second long holes 228a and 228b may be equal or different.

FIGS. 9A-10B illustrate the fixing member 230 according to an exemplary embodiment of the present disclosure. A case in which the display 201 is a flat type display and a case in which the display 201 is a curved type display (including a flexible display) according to an exemplary embodiment of the present disclosure will be described.

When the display 201 is a flat type display, all the first cover 220, the second cover 210, and the frame 205 have a plane shape with respect to a horizontal direction, and thus, the fixing member 230 having a single shape may be sufficient, but in a case in which the display 201 is a curved display, a shape of fixing members 232 used in both end portions of the display 201 is different from a shape of a fixing member 231 used in a middle portion of the display 201. That is, when the display 201 has a flat type display, it may be fixed using the first fixing member 230, but when the display 201 is a curved type display, the display 201 may be slightly bent and the second fixing member 232 illustrated in FIG. 9B may be used in the bent portion.

Referring to FIGS. 9A-10B, the first and second fixing members 231 and 232 each include a first portion 233 which is inserted into the first long hole 238a, a second portion 234 which extends from the first portion 233 vertically, is parallel to the first rib 229a, and is in contact with the first rib 229a, a third portion 235 which extends from the second portion 234 and traverses upper sides of the first and second ribs 229a and 229b, a fourth portion 236 which extends from the third portion 235 vertically, is parallel to the second rib 229b, and is in contact with the second rib 220b, and a fifth portion 237 which extends from the fourth portion 236 and is inserted into the second long hole 228b. The second portion 234 and the fourth portion 236 may be in contact with the first rib 229a and the second rib 229b, respectively, or may be in contact with an inner circumferential surface of the long hole 228 formed in the base portion 226, rather than being in direct contact with the first rib 229a and the second rib 229b.

When the second portion 234 and the fourth portion 236 are in contact with the first rib 229a and the second rib 229b, respectively, the first long hole 228a may be formed to have a width equal to a space between the first rib 229a and the vent hole formation portion 221 and the second long hole 228b may be formed to have a width equal to a space between the second rib 229b and the third rib 229c. When the fixing member 230 is inserted, the second portion 234 and the fourth portion 236 may be tightly attached to the first rib 229a and the second rib 229b, respectively.

In addition, the fixing member 230 may further include a first contact portion 238a which protrudes from the first portion 233, is parallel to the vent hole formation portion 221, and tightly attaches the bent portion 213 to the vent hole formation portion 221, and a second contact portion 238b which protrudes from the fifth portion 237, is parallel to the third rib 229c, and is tightly attached to the third rib 229c. Here, the bent portion 213 of the second cover 210 may be inserted between the vent hole formation portion 221 and the first contact portion 238a and tightly attached to the vent hole formation portion 221 by the first contact portion 238a.

Figure 8A:
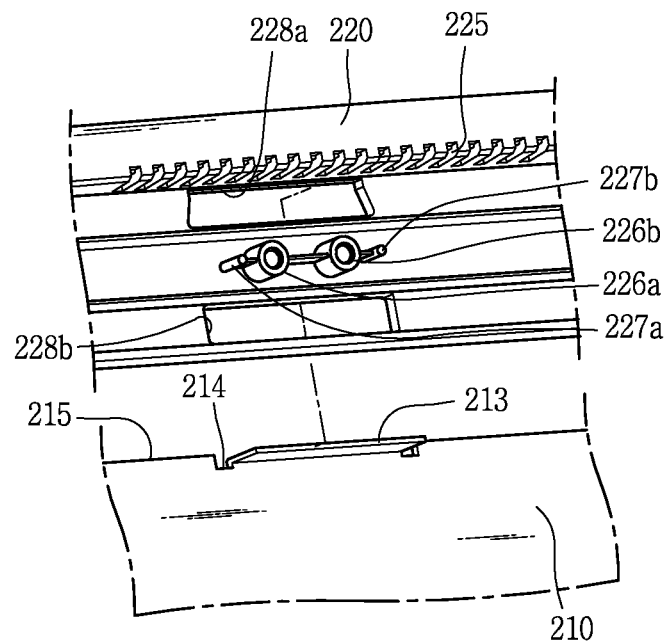
FIGS. 8A through 8E are perspective views illustrating order of coupling the back cover of the image display device according to an exemplary embodiment of the present disclosure.
Figure 8B:
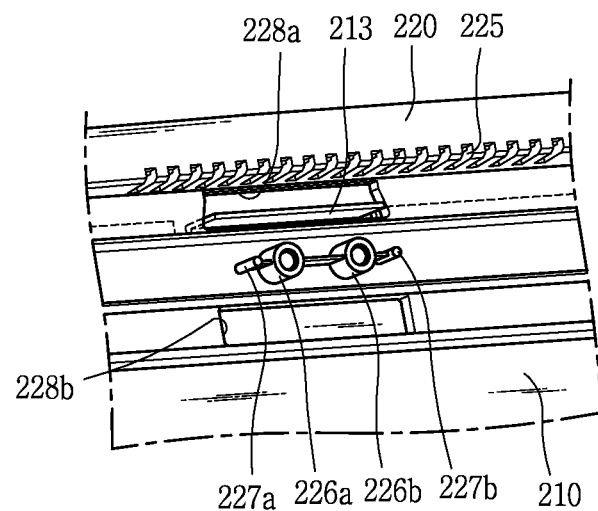

As illustrated in FIGS. 3 and 8A, the bent portion 213 is formed in a portion of an upper end portion of the second cover 210, is perpendicular to a main surface of the second cover 210, and is inserted into the first long hole 228a. The second cover 210 has the bent portion 213, and recesses 214 are formed in a portion where the bent portion 213 and the second cover 210 are connected, namely, in a lower end portion of the bent portion 213. Since the recesses 214 are formed, when the bent portion 213 is bent, stress may concentrate on the recesses 214, without being transmitted to other portions of the second cover 210.

Here, an insertion portion 215 inserted into the recess 227 formed in a lower end of the exposed portion 220a is formed in a portion, excluding the bent portion 213 and the recess 214, of the end portion of the second cover 210.

Referring to FIGS. 6 and 7, the bent portion 213 is fixed by the vent hole formation portion 221 and the first contact portion 238a, and as the insertion portion 215 is inserted into the recess 227 formed in the vent hole formation portion 221, the second cover 210 is coupled to the first cover 220.

Referring to FIGS. 8A-8E, in order to couple the fixing member 230 to the first cover 220, bosses 226a and 226b are formed in the base portion 226 of the coupling portion 220b and first holes 2311 and 2321 (see FIGS. 9A-9B) are formed in the fixing member 230. The fixing member 230 is coupled to the first cover 220 by a first fastening member 239 such as a bolt. Here, the bosses 226a and 226b are formed between the first rib 229a and the second rib 229b.

Also, protrusions 227a and 227b may be formed on at least one side of the bosses 226a and 226b. Second holes 2312 and 2322 (see FIGS. 9A-9B) are formed in the fixing members 231 and 232 such that the second holes 2312 and 2322 correspond to the protrusions 227a and 227b. The second holes 2312 and 2322 serve to temporarily fix the fixing members 231 and 232 when the fixing member 230 is coupled to the bosses 226a and 226b. That is, when the bosses 226a and 226b and the first holes 2311 and 2321 are aligned to be inserted in order to couple the fixing members 231 and 232 to the first cover 220, the protrusions 227a and 227b are inserted into the second holes 2312 and 2322 smaller than the first holes 2311 and 2321, preventing the fixing members 231 and 232 from moving.

The second holes 2312 and 2322 may be coupled to the protrusions 227a and 227b by using the first fastening members 239, or the positions of the second holes 2312 and 2322 may be fixed without using the first fastening members 239. Here, two first holes 2311 and 2321 and two second holes 2312 and 2322 may be provided and, in particular, the second holes 2312 and 2322 may be formed on both sides of the first holes 2311 and 2321. Also, the first and second holes 2311, 2321, 2312, and 2322 and the bosses 226a and 226b may be connected by a connection portion 224 protruding from the base, and thus, the protrusions 227a and 227b having a small diameter may be firmly supported.

Figure 10A:
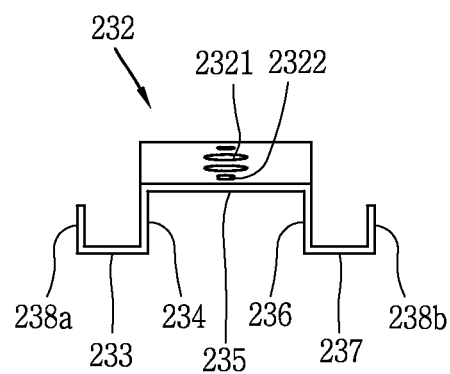
FIGS. 10A and 10B are a front view and a side view of the fixing member according to an exemplary embodiment of the present disclosure.
Figure 10B:
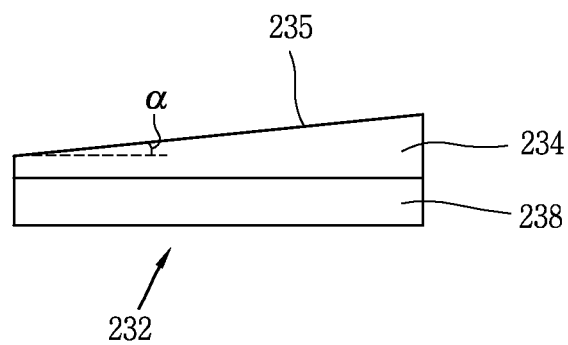

In addition, referring to FIGS. 10A-10B, the second fixing member 232 may be applied when the display 201 is a curved type display. When the display 201 has a curved shape, both ends of the first rib 229a and the second rib 229b has a height increasing in a direction towards a central portion of the display 201, and the fixing member 232 is formed to have a connection portion 224 having a slope (a) corresponding to the first rib 229a and the second rib 229b. FIG. 11 is a view illustrating the first cover 220 to which the first fixing member 231 is coupled, FIG. 12 is a view illustrating the first cover 220 to which the second fixing member 232 is coupled, and FIG. 13 is a view illustrating the first cover 220 to which the second fixing member 232 is coupled.

Figure 8C:
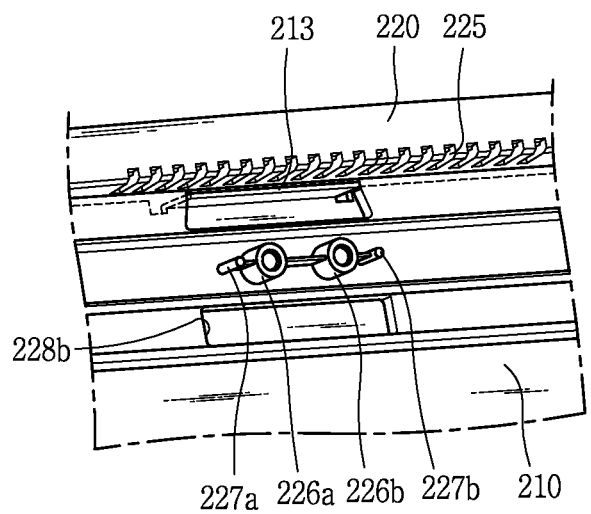
Figure 8D:
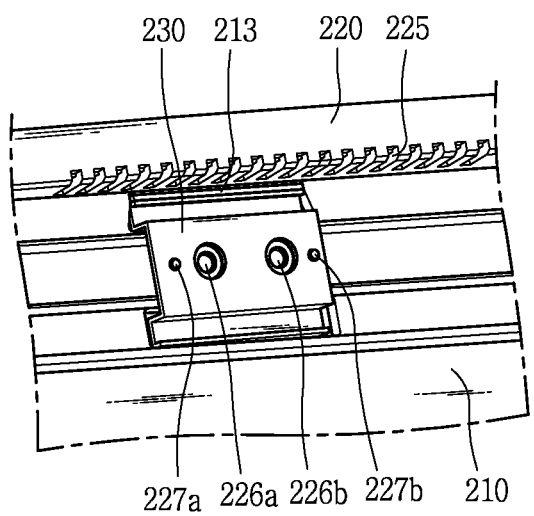

FIGS. 8A-8E are views illustrating a process of coupling the first cover 220 and the second cover 210 according to an exemplary embodiment of the present disclosure, which is applied to both the first fixing member 231 and the second fixing member 232. First, the bent portion 213 of the second cover 210 is inserted into the first long hole 228a of the first cover 220 (FIGS. 8A and 8B), and the bent portion 213 is pushed up in the first long hole 228a to secure a space in which the fixing member 230 can be inserted (FIG. 8C). Thereafter, the holes 2311 and 2321 are positioned in the bosses 226a and 226b and the second holes 2312 and 2322 are inserted into the protrusions 227a and 227b, whereby the fixing member 230 is prevented from being moved before being fastened (FIG. 8D). At this time, the first contact portion 238a of the fixing member 230 tightly attaches the bent portion 213 to the vent hole formation portion 221.

Figure 8E:
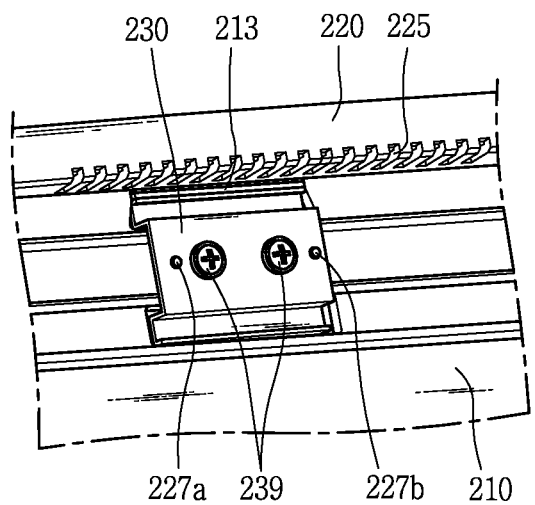
Figure 9A:
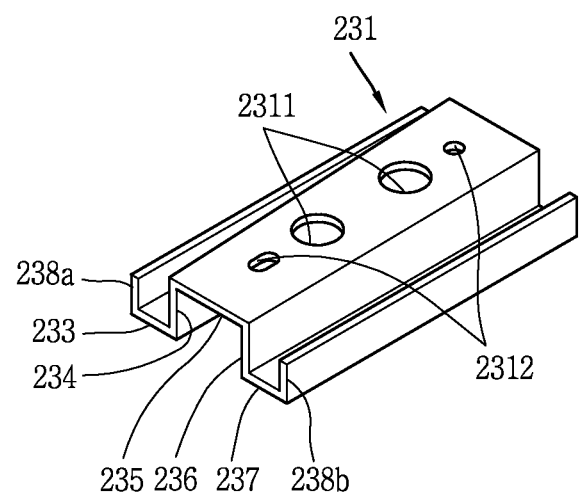
FIGS. 9A and 9B are perspective views illustrating types of fixing members according to an exemplary embodiment of the present disclosure.
Figure 9B:
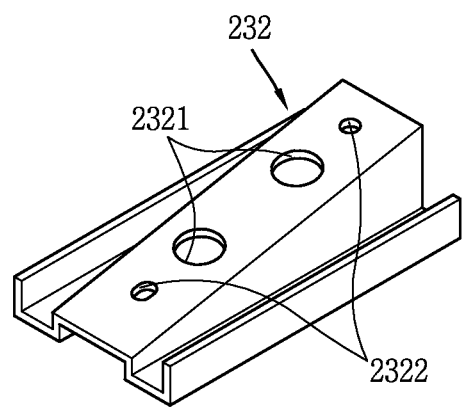

After the fixing member 230 is temporarily fixed as illustrated in FIG. 8D, the fixing member 230 is firmly fixed with the first fastening member 239 as illustrated in FIG. 8E. In this manner, the fixing member 230 tightly attaches the second cover 210 to the first cover 220, and as illustrated in FIG. 7, since the insertion portion 215 is inserted into the recess 227 formed in one portion of the vent hole formation portion 221, the second cover 210 may be more firmly fixed to the first cover 220.

Here, the first cover 220 may be a molded product, and the second cover 210 may be formed with metal. The first cover 220 and the second cover 210 are coupled to form a single back cover 200. Also, since the fixing member 230 is used, assembling and disassembling is facilitated.

Also, since the bent portion 213 and the insertion portion 215 are formed in the upper end portion of the second cover 210, the second cover 210 is prevented from being released from the first cover 220, and since the second cover 210 is inserted to overlap the first cover 220, external appearance may become elegant.

In addition, since the second cover 210 is formed to be large and the first cover 220 is formed to have a small size, a single material feeling, in particular a metallic feeling, may be provided.

The image display device described above may not be limited to the configuration and method of the exemplary embodiments described above but may be variously modified, for which a portion or the entirety of the exemplary embodiments may be selectively combined to be configured.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. An image display device comprising:
   a display to output an image;
   a frame to cover at least a partial upper portion of a rear surface of the display and form an appearance; and
   a back cover coupled to the frame to cover the rear surface of the display,
   wherein the back cover includes a first cover disposed in a horizontal direction and detachably coupled to the frame;
   a second cover coupled to the first cover and disposed to overlap with the first cover; and
   a fixing member disposed at an inner side of the first cover and the second cover and fixes the second cover to the first cover,
   wherein an exposed portion includes:
   a vent hole formation portion having a recess formed at an outer end portion thereof and allowing an upper end of the second cover to be inserted therein and a plurality of vent holes formed at the vent hole formation portion thereof;
   a vertical portion extending upwardly from the vent hole formation portion; and
   a heat blocking portion extending from the vertical portion and coupled to the frame to prevent introduction of heat emitted from the vent holes back to the image display device.

2. The image display device of claim 1, wherein the first cover includes: the exposed portion outwardly exposed and disposed between the frame and the second cover; and
   a coupling portion extending downwardly from the exposed portion to overlap with the second cover, and disposed at the inner side of the second cover.

3. The image display device of claim 1, wherein the coupling portion includes:
   a base portion having a plate shape and extending downwardly from an end of the exposed portion; and
   first, second and third ribs disposed in a horizontal direction at an inner side of the base portion, wherein a first long hole is formed between the first rib and the vent hole formation portion, a second long hole is formed between the second rib and the third rib, and the fixing member is inserted into the first and second long holes.

4. The image display device of claim 3, wherein the fixing member includes:
   a first portion inserted into the first long hole;
   a second portion extending vertically from the first portion and formed to be parallel to the first rib;
   a third portion extending from the second portion and traversing upper portions of the first and second ribs;
   a fourth portion extending vertically from the third portion and formed to be parallel to the second rib; and
   a fifth portion extending from the fourth portion and inserted into the second long hole.

5. The image display device of claim 4, wherein a boss is disposed between the first and second ribs at the inner surface of the base portion, a first hole is formed at a position of the third portion of the fixing member corresponding to the boss, and the fixing member is fixed to the first cover by a first fastening member passing through the first hole and the boss.

6. The image display device of claim 5, wherein a protrusion is disposed at one side of the boss at the inner surface of the base portion, a second hole is formed at a position of the third portion corresponding to the protrusion, and the protrusion is insertedly fixed to the second hole.

7. The image display device of claim 6, wherein the boss and the protrusion are connected by a connection portion.

8. The image display device of claim 4, wherein the second cover includes a main surface and further includes a bent portion disposed to be perpendicular to the main surface of the second cover and inserted into the first long hole.

9. The image display device of claim 8, wherein the fixing member further includes a first contact portion vertically extending from the first portion and disposed to be parallel to the vent hole formation portion to fix the bent portion to the vent hole formation portion.

10. The image display device of claim 8, wherein the second cover further includes an insertion portion inserted into a recess formed at the vent hole formation portion, and
the bent portion and the insertion portion are connected to each other.

11. The image display device of claim 4, wherein the fixing member further includes a second contact portion extending vertically from the fifth portion and disposed to be parallel to the third rib.

12. The image display device of claim 11, wherein the fifth portion is in contact with the third rib.

13. The image display device of claim 4, wherein the second portion and the fourth portion are in contact with inner surfaces of the first and second long holes or are in contact with the first rib and the second rib, respectively.

14. The image display device of claim 3, wherein the display has a curved shape, wherein both ends of the first rib and the second rib have a height increasing in a direction towards a central portion of the display, and the fixing member is sloped to correspond to the first rib and the second rib.

15. The image display device of claim 1, wherein a through hole is formed in the vertical portion, and the first cover is fixed to the frame by coupling a second fastening member to the frame through the through hole.

16. The image display device of claim 1, wherein the first cover is formed with non-metal, and the second cover is formed with metal.

17. The image display device of claim 1, wherein the frame includes:
a sloped portion that slopes outwardly down from an upper end portion thereof;
a horizontal portion extending from the sloped portion and recessed inwardly toward the display; and
a mounting portion extending from the horizontal portion and allowing the first cover or the second cover to be mounted thereon.

18. The image display device of claim 17, wherein the exposed portion is disposed between the horizontal portion and the mounting portion.

19. The image display device of claim 18, wherein an edge portion protruding toward the horizontal portion is disposed in an end portion of the heat blocking portion, and a support portion having a height corresponding to the edge portion is disposed below the horizontal portion.

* * * * *